US006303974B1

(12) United States Patent
Irons et al.

(10) Patent No.: US 6,303,974 B1
(45) Date of Patent: Oct. 16, 2001

(54) SEMICONDUCTOR CHIPS ENCAPSULATED WITHIN A PREFORMED SUB-ASSEMBLY

(75) Inventors: Robert Charles Irons; Kevin Robert Billett; Michael John Evans, all of Wiltshire (GB)

(73) Assignee: Westcode Semiconductors Limited (GB)

( * ) Notice: Subject to any disclaimer, the term of this patent is extended or adjusted under 35 U.S.C. 154(b) by 0 days.

(21) Appl. No.: 09/206,673

(22) Filed: Dec. 7, 1998

(30) Foreign Application Priority Data

Dec. 8, 1997 (GB) ................................................. 9725960

(51) Int. Cl.[7] .................................................. H01L 27/082
(52) U.S. Cl. ...................... 257/584; 257/582; 257/690; 257/698; 257/699; 257/704; 257/705; 257/706; 257/707; 257/708; 257/719; 257/723; 257/732
(58) Field of Search .................................. 257/698, 680, 257/690, 699, 704–708, 719, 723, 732, 528, 582, 584, 177

(56) References Cited

U.S. PATENT DOCUMENTS

| 4,667,219 | | 5/1987 | Lee et al. . | |
|---|---|---|---|---|
| 5,221,851 | * | 6/1993 | Gobrecht et al. | 257/177 |
| 5,297,001 | * | 3/1994 | Sterling | 361/717 |
| 5,641,976 | * | 6/1997 | Taguchi et al. | 257/178 |
| 5,705,853 | * | 1/1998 | Faller et al. | 257/719 |

FOREIGN PATENT DOCUMENTS

| 0 702 406 | | 3/1996 | (EP) . | |
|---|---|---|---|---|
| 0 746 023 | | 12/1996 | (EP) . | |
| 0746023 A2 | * | 12/1996 | (EP) | H01L/23/48 |
| 0 773 585 | | 5/1997 | (EP) . | |

WO 98/43301   10/1998  (WO) .

OTHER PUBLICATIONS

"Thyristor Design and Realization", Design amd Measurement in Electrical and Electronic Engineering, 1987, pp. 206–209.
Copy of European Search Report Dated Aug. 23, 1999 for Corresponding European Application No. 98309738.7–1270.
Copy of Patent Abstracts of JP 09 008 279, vol. 097, No. 005, May 30, 1997.

* cited by examiner

Primary Examiner—Eddie Lee
Assistant Examiner—Matthew E. Warren
(74) Attorney, Agent, or Firm—Christie, Parker & Hale, LLP

(57) ABSTRACT

In a housing of a semiconductor device there are provided a plurality of semiconductor chips captivated in a preformed sub-assembly and arranged to present contact areas for connection to anode and emitter electrodes of the semiconductor housing. Electrically conductive contact pin arrangements project from electrically insulated channels in the preformed sub-assembly, an inward end of each of the pin arrangements being so arranged, when urged into its channel, as to provide an electrical connection to a part of the surface of a semiconductor chip. There is a sheet of electrically conductive material, resting on a base level of an inner surface of the emitter electrode and electrically isolated therefrom by an electrically insulating insert, as a means for distributing an electrical signal and making simultaneous contact with the opposite ends of the pin arrangements. The channels and the pin arrangements are such that the pin arrangements are out of contact with the semiconductor chips when the preformed sub-assembly is not supported on a surface which interacts with the opposite ends of the pin arrangements.

13 Claims, 6 Drawing Sheets

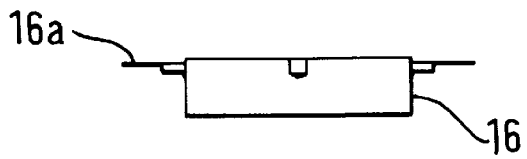
FIG.1
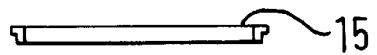
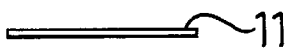
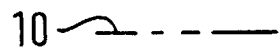
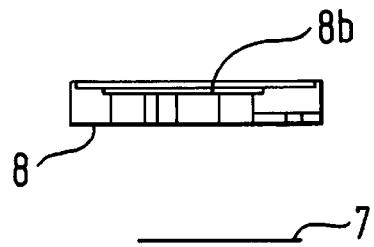
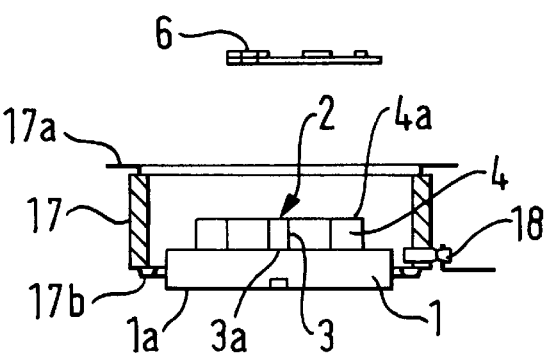

SEMICONDUCTOR CHIPS ENCAPSULATED WITHIN A PREFORMED SUB-ASSEMBLY

FIELD OF THE INVENTION

The present invention relates to the encapsulation of semiconductor chips, such as the encapsulation of a plurality of insulated gate bipolar transistor (IGBT) chips in a single housing of the double-side-cooled type with the option of including other components such as an anti-parallel diode and/or resistive connecting paths.

BACKGROUND OF THE INVENTION

An IGBT device has a highly complex fine geometry structure that effectively limits the size of a single IGBT chip which can be processed with an acceptable yield. Where an IGBT device of larger size is required it may be produced from an assembly of chips encapsulated in a single unit. In the main, such units have been produced in a single-side-cooled arrangement where the chips are mounted on a thermally and electrically conducting base plate or stud constituting an anode terminal and cooling contact. The emitter and gate leads are connected in common to their respective electrodes in a header seal. In order to avoid undesirable interaction between the separate chips, the connection from the common gate point to each individual chip characteristically includes a ballast resistance in its path. The inductive loop between emitter and gate leads is also desirably kept to a minimum.

To maximise the useful current rating of silicon power devices, especially diodes, thyristors and gate turn-off thyristors and to provide efficient cooling together with greater flexibility of application it has become common practice to provide disc-like encapsulations (sometimes known as the "hockey-puck" style) which may be cooled from either or both of the pole-pieces constituting the main current electrodes. The structure of such a device encapsulation is described in "Thyristor Design and Realization" by P. D. Taylor (Wiley, 1987)—see p.208 and FIG. 6.7 of the 1992 paperback edition. There are similar advantages to the user when IGBT devices are encapsulated likewise. EP-A-0 702 406 shows such a device incorporating a plurality of IGBT chips. However the internal connections shown therein, particularly those relating to distribution of the gate signal, are complex and imply potential difficulties for manufacturers seeking to offer devices in this form. There may also be mentioned as prior art EP-A- 0 773 585 and EP-A- 0 746 023.

SUMMARY OF THE INVENTION

According to the present invention from one aspect, there is provided a semiconductor device comprising, in a housing:
  a plurality of semiconductor chips captivated in a preformed sub-assembly and arranged to present contact areas for connection to anode and emitter electrodes of the housing; and
  electrically conductive contact pin arrangements projecting from electrically insulated channels in the preformed sub-assembly, an inward end of each of said pin arrangements being so arranged, when urged into its channel, as to provide an electrical connection to a part of the surface of a semiconductor chip, wherein:
  there is a sheet of electrically conductive material, resting in recesses on the inner surface of the emitter electrode and electrically isolated therefrom by an electrically insulating insert, as a means for distributing an electrical signal and making simultaneous contact with the opposite ends of said pin arrangements.

The channels and the pin arrangements may be such that the pin arrangements are out of contact with the semiconductor chips when the preformed sub-assembly is not supported on a surface which interacts with the opposite ends of said pin arrangements.

The housing may be of the double-side-cooled type.

The emitter electrode may have a first, outer planar face and an opposing, inner surface comprising pillars of material delineated by recesses formed on the inner surface of the electrode, the walls of the pillars being substantially at right angles to the outer face of the emitter electrode and the top faces of the pillars being coplanar and substantially parallel to the first, outer face. The recesses may all be formed to the same depth to define a uniform base level on the inner side of the emitter electrode.

Said pre-formed sub-assembly may include a preform of electrically insulating material and contain apertures to accommodate the pillars so that it can be lowered thereover, the preform being of such height that, when finally assembled, it stands a little higher than the tops of the pillars and being also provided with a shallow recessed central area essentially level with the tops of the pillars.

Said channels may be in the insulating preform and run parallel and close to the walls of the pillars.

An electrically conductive retaining shim may be positionally located in the central recessed area of said preform and apertured so as not to obstruct or occlude the ends of said channels.

An electrically insulating frame with rebated windows may be positioned so that the window apertures correspond generally to the lateral boundaries of the pillars but are extended to include the vertical projections of the channels, an electrically conductive buffer shim and one of the semiconductor chips being serially located in each window aperture and window rebate respectively to rest on the retaining shim above the top surface of a respective one of the pillars so as to present said part of the surface of the semiconductor chip toward the inward end of the conductive contact pin arrangement occupying the respective channel.

A thermally and electrically conducting buffer plate may be arranged to overlie and contact the upper faces of all such semiconductor chips.

A collar clip may captivate the retaining shim, the buffer shims, the semiconductor chips and the buffer plate in the preform.

The semiconductor chips may be of a mixture of types, e.g. IGBT chips and diode chips with the contact pin arrangements being applied only to those requiring them.

The emitter and anode electrodes may be provided with metal flanges to one of which is attached an insulating collar with a further flange joined (e.g. by welding) to the flange on the other main electrode so that all the assembled parts are sealed in an hermetic capsule forming the housing. The common electrical signal or gate point may be at the inner end of a lead-through conductor set in the wall of the insulating collar and electrically attached to the conductive sheet, the outer end of the lead-through conductor being for the signal or gate electrode of the device.

Other modifications or additions to the overall structure may also be made. The emitter electrode may be in two parts, the first carrying the insulating collar and the second carrying the pillars. By this means the material of the second part of the emitter electrode may be chosen so that the lateral distance separating the pillars is constrained to expand thermally at a rate nearer to that of a buffer plate overlying the semiconductor chips. Each contact pin arrangement may incorporate its own means of springing to make resilient contact with both the sheet of conductive material and its associated semiconductor chip or alternatively the sheet may incorporate such means of resilience to urge a contact pin arrangement into contact with its chip.

The conductive sheet may have included within or attached to its structure resistors lying in the respective paths to each contact pin arrangement or a resistor may be incorporated within the structure of each contact pin arrangement or a resistor may be incorporated within or attached to the structure of each contact pin arrangement contacted semiconductor chip.

According to the present invention from another aspect, there is provided a semiconductor device comprising, in a housing:

a plurality of semiconductor chips captivated in a preformed sub-assembly and arranged to present contact areas for connection to anode and emitter electrodes of the housing; and electrically conductive contact pin arrangements projecting from electrically insulated channels in the preformed sub-assembly, an inward end of each of said pin arrangements being so arranged, when urged into its channel, as to provide an electrical connection to a part of the surface of a semiconductor chip, wherein:

the channels and the pin arrangements are such that the pin arrangements are out of contact with the semiconductor chips when the preformed sub-assembly is not supported on a surface which interacts with the opposite ends of said pin arrangements.

BRIEF DESCRIPTION OF THE DRAWINGS

The present invention will now be described, by way of example, with reference to the accompanying drawings, in which:

FIG. 1 shows an exploded array the sequence components in an assembly in accordance with an example of the invention of five IGBT semiconductor chips together with two further diode chips;

DESCRIPTION OF PREFERRED EMBODIMENTS

Figure 3:
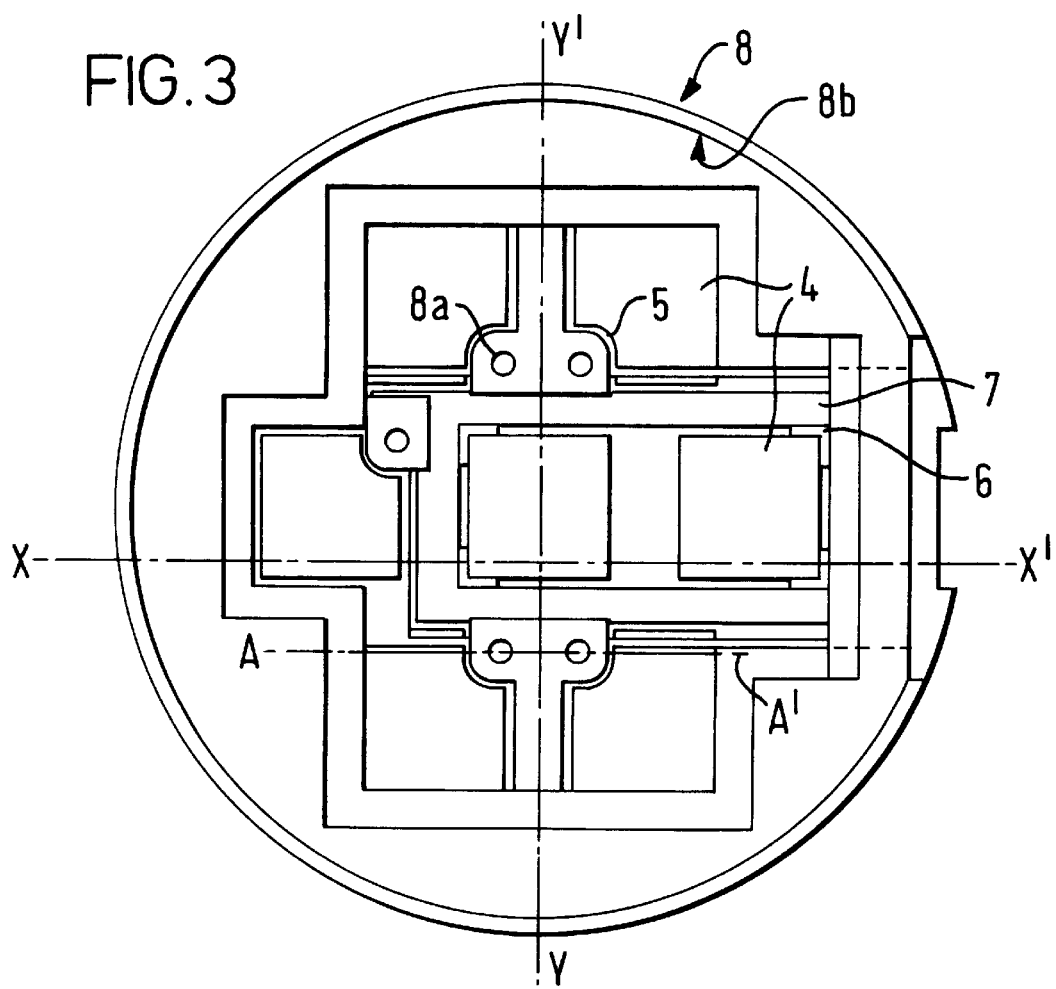
FIG. 3 is a plan view of part of the assembly of components.
Figure 4:
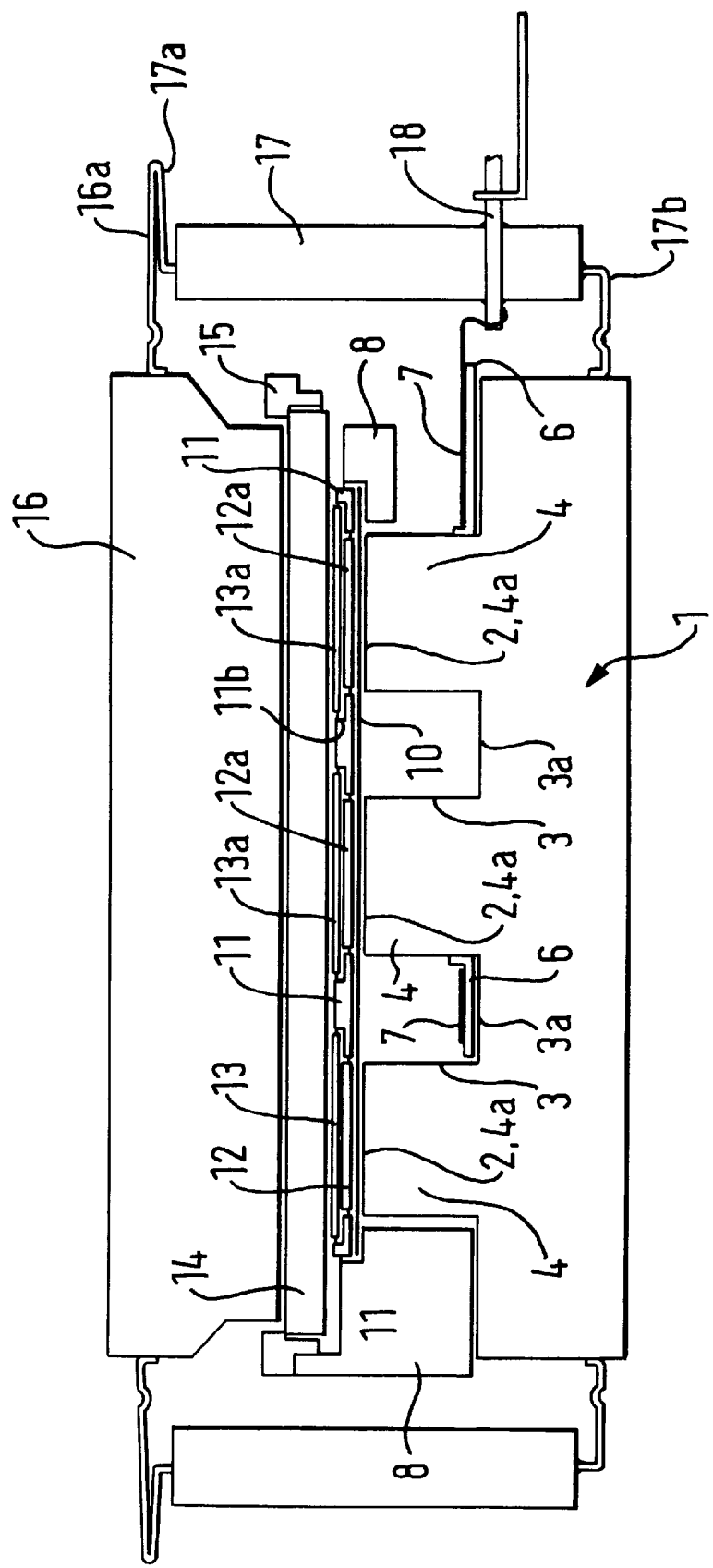
FIGS. 4 to 6 are sections through the assembly as indicated by X–X', Y–Y'and A–A'respectively of FIG. 3.
Figure 5:
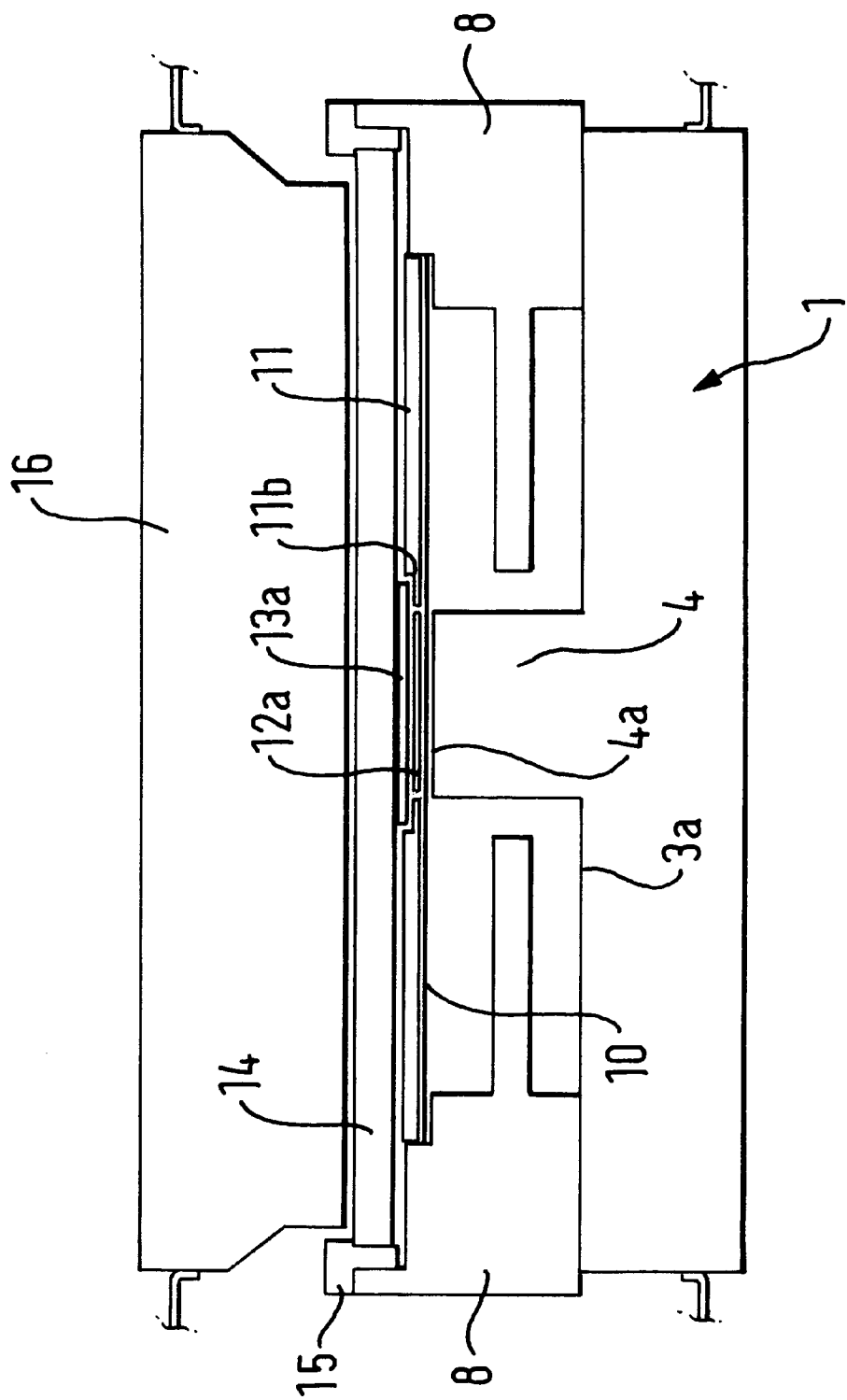
Figure 6:
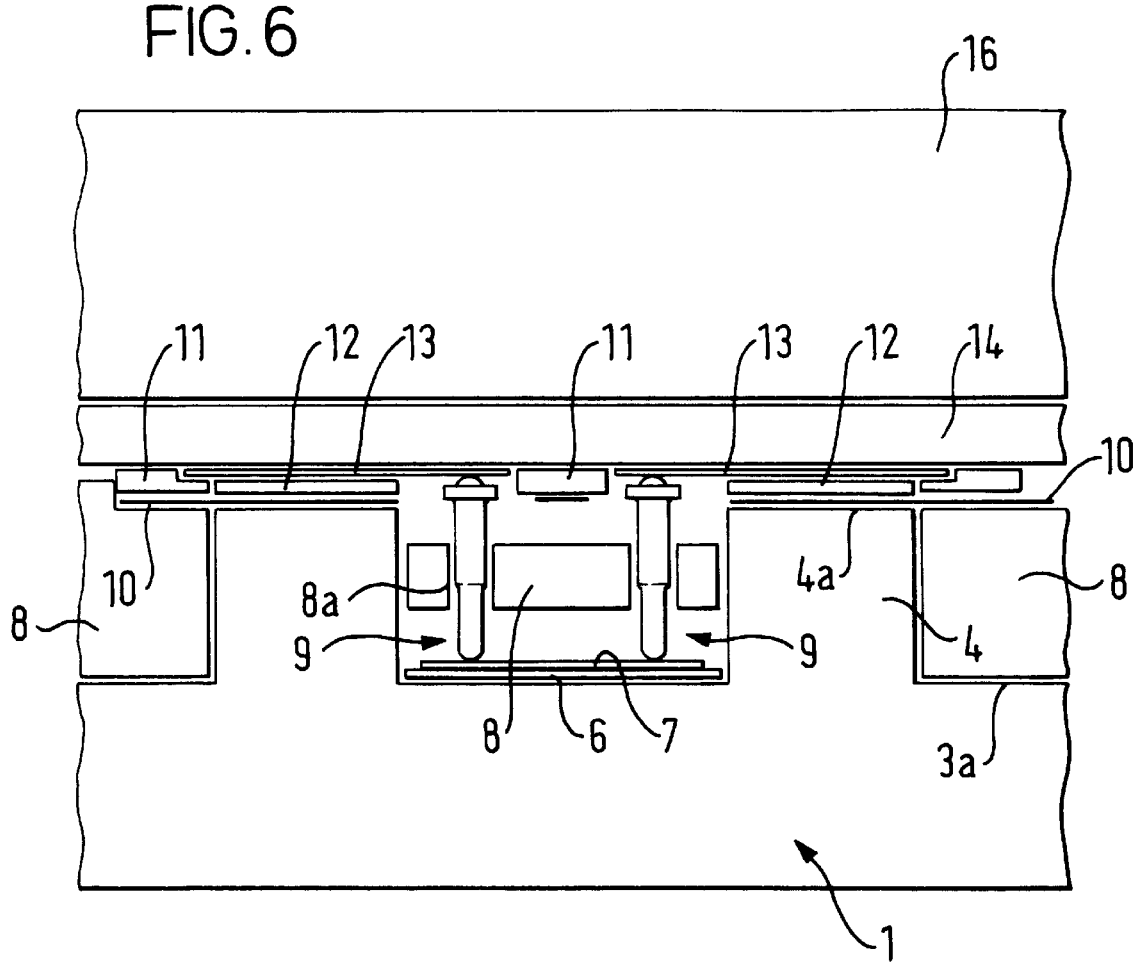

FIG. 1 and FIGS. 4 to 6 show a disc-like copper main electrode 1 for use as an emitter contact and cooling member provided with a planar face la and an opposing face 2 which has slots 3 cut into it to a certain base level 3a so that seven upstanding pillars 4 are created. Generally, the pillars 4 are of square horizontal cross-section but five of them each has an excision in its section shown in FIG. 3 as a smaller square 5 removed from one corner to leave an L-shaped section.

The exact form of an excision is dictated by the contact requirement of the chips to be later assembled and may be varied accordingly together with the form of other mating components to be described.

An electrically insulating insert 6 of minimal thickness is placed at the base of the slots 3 in order to locate and electrically isolate from the electrode 1 a copper sheet 7 to act as a means for distributing a gate signal.

It should be noted that the electrically insulating insert 6 and the copper sheet 7 may be combined as a laminate or replaced by a metallised insulator to perform the same function.

Figure 2:
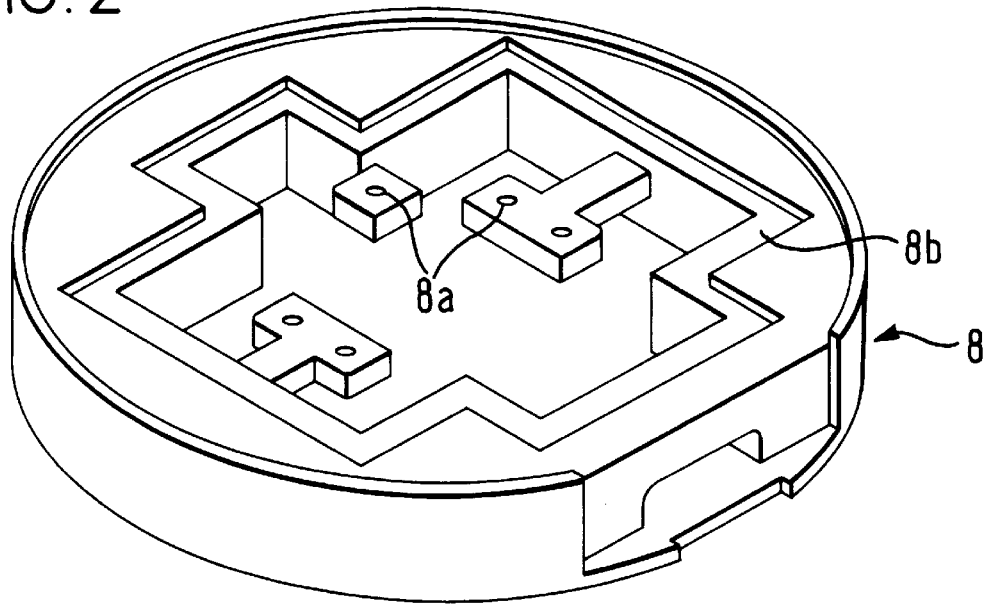
FIG. 2 is an isometric view of an insulating preform of the assembly.

An insulating preform 8 is so shaped that it fits over and around the upstanding pillars 4 and in particular occupies the spaces left by the excisions. The preform 8 rests on the insulating insert 6 serving also thereby to hold the copper sheet 7 in place. Each part of the preform occupying an excision 5 is provided with a channel 8a (FIGS. 2, 3) running parallel to the height of the respective pillar 4.

Figure 7:
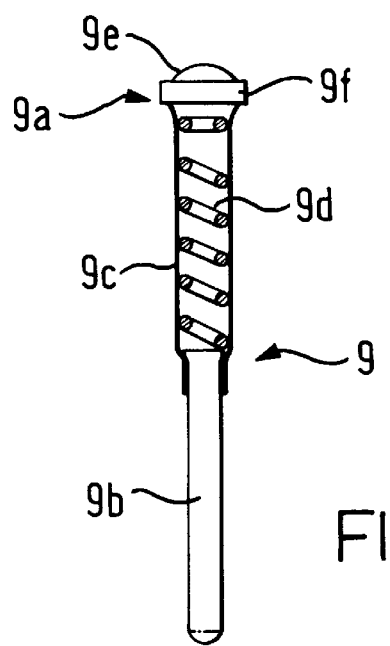
FIG. 7 shows a construction of one of the contact pin arrangements of the assembly.

Into each channel 8a is inserted a respective spring-loaded contact pin arrangement 9 (see FIG. 7) with a head 9a as sufficiently enlarged that it cannot fall down through the channel. Each contact pin arrangement 9 comprises a contact pin 9b slidable in a sleeve 9c against a spring 9d in the sleeve 9c and a head contact 9a. Each contact pin arrangement 9 is also designed in this example to provide a series resistance by virtue of a resistor 9f so as to help in equalising the distribution of signal current to the semiconductor chips.

The top of the outer part of the preform 8 is above the tops of the pillars 4 but it is recessed over its central part 8b encompassing the area occupied by the pillars 4, the slots 3 and the excision 5 so as to be essentially level with, but never above, the top faces 4a of the pillars 4. A nickel plated copper retaining shim 10 is uniquely positioned in the recessed area to lie flat on the tops of the pillars 4 and is provided with apertures 10a corresponding to the positions of the excisions 5 in order to accommodate the heads 9a of the pin arrangements 9. An insulating frame 11 with rebated windows 11a is placed on top of the retaining shim 10 and positioned with reference to the surrounding outer part of the preform 8. Each window 11a corresponds to the square lateral boundary of a pillar 4 so that a molybdenum buffer shim 12 or 12a according to type may be centred above the top of each pillar. Each shim 12 has a shape corresponding to the cross-section of a pillar 4 with an excision 5 and is correspondingly orientated on assembly whereas each shim 12a is square.

Semiconductor chips 13 or 13a are slightly larger than the molybdenum buffer shims 12 or 12a and each takes its position from the dimension of the rebate 11b around each window. IGBT chips 13, each requiring a gate connection, are placed emitter face down above pillars 4, each orientated with its gate contact area immediately over a contact pin arrangement 9 using an intervening molybdenum shim 12, whereas diode chips 13a are placed anode down on pillars 4 with no excisions using an intervening molybdenum shim 12a. The sums of the thicknesses of each shim 12 or 12a and its corresponding chip 13 or 13a are carefully arranged to be as equal as possible so that the upper faces of all of the chips lie essentially coplanar and above the level of the frame 11.

A buffer plate 14 also of molybdenum is placed on top of the assembled chips and is centralised by the outer rim of the preform 8 and held in place by a collar clip 15 attachable to the preform 8.

The encapsulation is completed by a disc-like copper electrode 16 to serve as an anode contact and cooling member carrying a flange 16a which may be welded to a corresponding flange 17a carried by a tubular ceramic collar 17 attached at its other end by a diaphragm 17b to the peripheral wall of the emitter electrode 1. An electrical lead-through seal 18 set in the wall of the ceramic housing is internally connected to the copper sheet 7 and serves externally as a gate electrode. The electrical path from the gate terminal to each individual IGBT chip is provided with its own ballast resistor by virtue of the resistors 9f incorporated in the contact pin arrangements 9. It would be equally feasible to attach each resistor to the surface of the copper sheet 7 where the respective pin 9b will make contact on assembly or else include it in the structure of the IGBT chip itself. The small displacement between the copper sheet 7 and the material of the emitter electrode at the base 3a of the slots 3 and also between the pillars 4 and the respective contact pins 9b secures a low loop inductance in the path of a signal applied between the gate and the emitter electrodes and the resulting current distribution is determined essentially by the ballast resistors.

A principal advantage of the foregoing is that for ease of assembly the preform 8 and the various components resting thereon can be independently pre-assembled as a sub-assembly with the lower ends of the contact pin arrangements 9 unsupported so that they do not press upwards on the IGBT chips to prevent them lying flat. After the collar clip 15 is in place the preform 8 with the captivated parts can be easily lowered over the pillars 4 to rest on the insulating insert 6 at the same time urging the spring-loaded contact pin arrangements 9 into contact with the copper sheet 7 at their lower ends (via pins 9b) and the IGBT chips 13 at their opposite ends (via head contacts 9a l).

A further advantage is that the preformed sub-assembly of captivated parts may also be inserted in a special jig to emulate the normal connections provided by the emitter, anode and gate electrodes except that the connection to the lower end of each pin 9b is separately operable instead of being commoned. Thus each chip may be individually tested for its gate response and any defective ones identified and replaced.

The above example may be modified by using non-compressible contact pin arrangements urged into contact with the chip by resilience in the copper sheet 7, e.g. by the use of beryllium-copper or phosphor-bronze material formed into spring contacts at the appropriate positions or using contact pin arrangements each comprising a sprung pin with a friction fit in the channel 8a where the critical frictional force is less than the thrust generated within the sprung pin when compressed by the assembly of the parts, so that the pin is not able to stick in a non-contact position.

Figure 8:
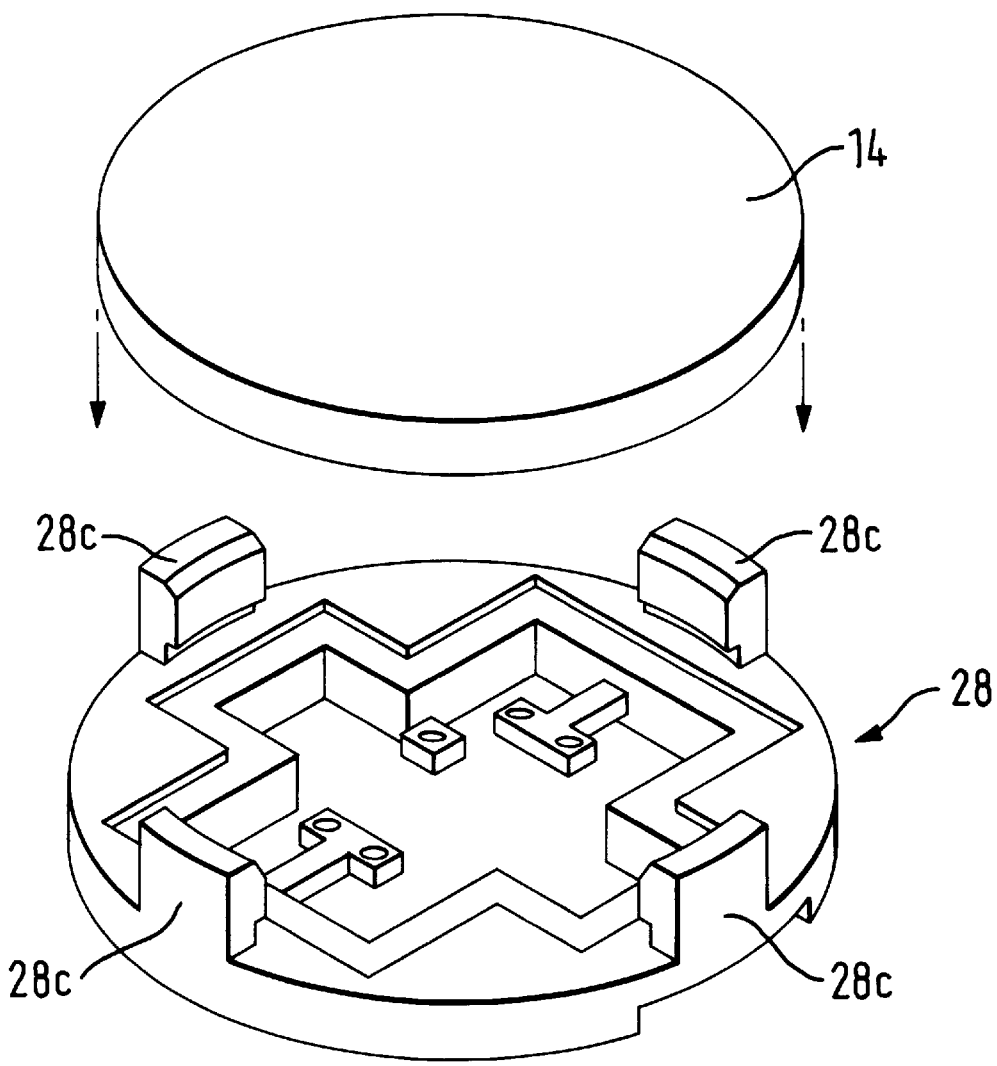
FIG. 8 is an illustration of an alternative form of insulating preform.
Figure 9:
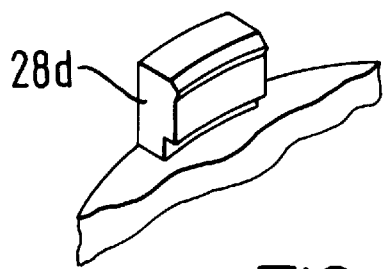
FIG. 9 shows an alternative construction to part of the preform of FIG. 8.

FIG. 8 shows a modified preform 28 combining the functions of the preform 8 (FIGS. 1 to 6) and the collar clip 15 (FIGS. 1, 4, 5), together with the buffer plate 14 and arrows to indicate the eventual mode of assembly of the two parts. The modified preform 28 is provided with resilient retaining tabs 28c which grip and retain the buffer plate 14 when it is pressed into position, thereby eliminating the need for the collar clip. A variant of the retaining tab feature is shown as item 28d (see FIG. 9). In this case the tab has been provided on its inner face with a ridge which may engage with a groove or grooves (not shown) on the outer cylindrical edge surface of buffer plate 14 to provide more positive retention.

What is claimed is:

1. A semiconductor device comprising, in a housing:
   a plurality of semiconductor chips captivated in a preformed sub-assembly and arranged to present contact areas for connection to anode and emitter electrodes of the housing; and
   electrically conductive contact pin arrangements projecting from electrically insulated channels in the preformed sub-assembly, an inward end of each of said pin arrangements being so arranged, when urged into its channel, as to provide an electrical connection to a part of the surface of a semiconductor chip, wherein:
   there is a sheet of electrically conductive material, resting in recesses on the inner surface of the emitter electrode and electrically isolated therefrom by an electrically insulating insert, as a means for distributing an electrical signal and making simultaneous contact with the opposite ends of said pin arrangements;
   the emitter electrode has a first, outer planar face and an opposing, inner surface comprising pillars of material delineated by recesses formed on the inner surface of the emitter electrode, the walls of the pillars being substantially at right angles to the outer face of the emitter electrode and top faces of the pillars being coplanar and substantially parallel to the first, outer face; and
   said preformed sub-assembly includes a preform of electrically insulating material and contains apertures to accommodate the pillars so that it can be lowered thereover, the preform being of such height that, when finally assembled, it stands a little higher than the tops of the pillars and being also provided with a shallow recessed central area essentially level with the tops of the pillars.

2. A device according to claim 1, wherein the channels and the pin arrangements are such that the pin arrangements are out of contact with the semiconductor chips when the preformed sub-assembly is not supported on a surface which interacts with the opposite ends of said pin arrangements.

3. A device according to claim 1, wherein said recesses formed on the inner surface of the emitter electrode are formed to the same depth to define a uniform base level on the inner side of the emitter electrode.

4. A device according to claim 1, wherein said channels are in the insulating preform and run parallel and close to the walls of the pillars.

5. A device according to claim 1, wherein an electrically conductive retaining shim is positionally located in the central recessed area of said preform and apertured so as not to obstruct or occlude the ends of said channels.

6. A device according to claim 5, wherein an electrically insulating frame with rebated windows is positioned so that the window apertures correspond generally to the lateral boundaries of the pillars but are extended to include the vertical projections of the channels, and an electrically conductive buffer shim and one of the semiconductor chips are serially located in each window aperture and window rebate respectively to rest on the retaining shim above the top surface of a respective pillar so as to present said part of the surface of the semiconductor chip toward the inward end of the conductive contact pin arrangement occupying the respective channel.

7. A device according to claim 1, wherein a thermally and electrically conducting buffer plate is arranged to overlie and contact the upper faces of all such semiconductor chips.

8. A device according to claim 6, wherein a collar clip captivates the retaining shim, the buffer shims, the semiconductor chips and the buffer plate in the preform.

9. A device according to claim 1, wherein the emitter and anode electrodes are provided with metal flanges to one of which is attached an insulating collar with a further flange joined to the flange on the other main electrode so that all the assembled parts are sealed in an hermetic capsule forming said housing.

10. A device according to claim 9, wherein a common electrical signal or gate point is at the inner end of a lead-through conductor set in the wall of the insulating collar and electrically attached to the conductive sheet, the outer end of the lead-through conductor being for the signal or gate electrode of the device.

11. A device according to claim 9, wherein the emitter electrode is in two parts, the first carrying the insulating collar and the second carrying the pillars.

12. A device according to claim 1, wherein each contact pin arrangement incorporates its own means of springing to make resilient contact with both the sheet of conductive material and its associated semiconductor chip or said sheet incorporates means of resilience to urge a contact pin arrangement into contact with its chip.

13. A device according to claim 1, wherein said conductive sheet has included within or attached to its structure resistors lying in the respective paths to each contact pin arrangement or a resistor is incorporated within the structure of each contact pin arrangement or a resistor is incorporated within or attached to the structure of each contact pin arrangement-contacted semiconductor chip.

* * * * *